United States Patent
Kim et al.

(10) Patent No.: US 7,521,780 B2
(45) Date of Patent: Apr. 21, 2009

(54) INTEGRATED CIRCUIT PACKAGE SYSTEM WITH HEAT DISSIPATION ENCLOSURE

(75) Inventors: Taeho Kim, Seoul-si (KR); Tae Keun Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 271 days.

(21) Appl. No.: 11/354,694

(22) Filed: Feb. 14, 2006

(65) Prior Publication Data

US 2007/0108597 A1 May 17, 2007

Related U.S. Application Data

(60) Provisional application No. 60/594,645, filed on Apr. 26, 2005.

(51) Int. Cl.
*H01L 23/34* (2006.01)
(52) U.S. Cl. ............... 257/675; 436/123; 257/E23.051; 257/E23.092
(58) Field of Classification Search ................ 257/706, 257/712, 796, E23.051, 675; 438/123
See application file for complete search history.

(56) References Cited

U.S. PATENT DOCUMENTS

| 6,525,942 | B2 | 2/2003 | Huang et al. | |
|---|---|---|---|---|
| 6,882,041 | B1* | 4/2005 | Cheah et al. | 257/704 |
| 6,963,141 | B2 | 11/2005 | Lee et al. | |
| 6,967,126 | B2 | 11/2005 | Lee et al. | |
| 6,967,403 | B2 | 11/2005 | Chuang et al. | |
| 2005/0248038 | A1 | 11/2005 | Corisis | |
| 2006/0060952 | A1* | 3/2006 | Yuan et al. | 257/675 |

* cited by examiner

*Primary Examiner*—Victor A Mandala
*Assistant Examiner*—Krista Soderholm
(74) *Attorney, Agent, or Firm*—Mikio Ishimaru

(57) ABSTRACT

An integrated circuit package system is provided providing an integrated circuit die, and enclosing the integrated circuit die in a heat dissipation enclosure comprises mounting the integrated circuit die on a die paddle attaching a heat block ring to the die paddle around the integrated circuit die, and attaching a heat slug on the heat block ring over the integrated circuit die.

20 Claims, 4 Drawing Sheets

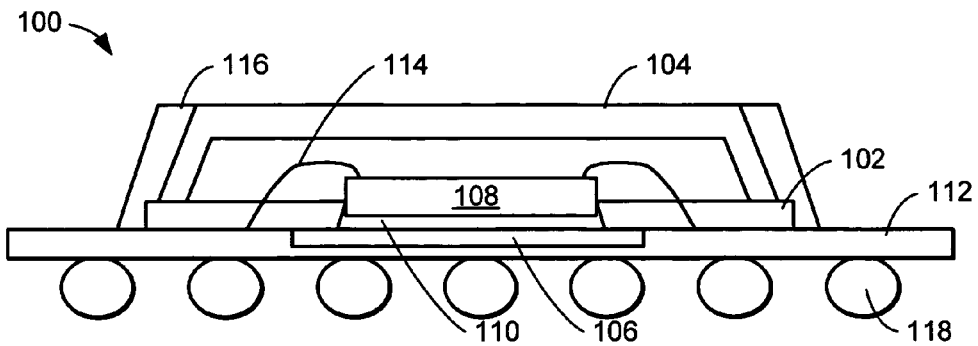
FIG. 1
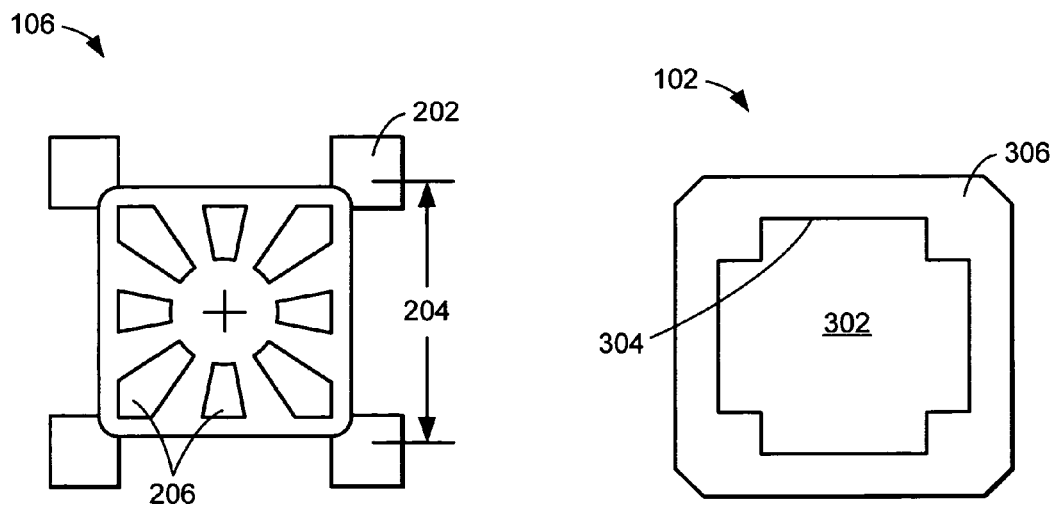
FIG. 2
FIG. 3

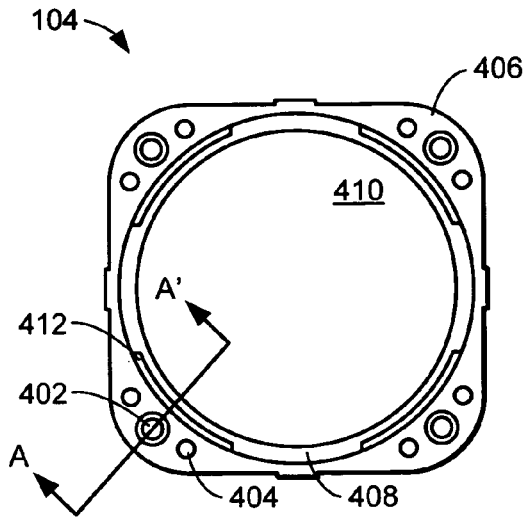
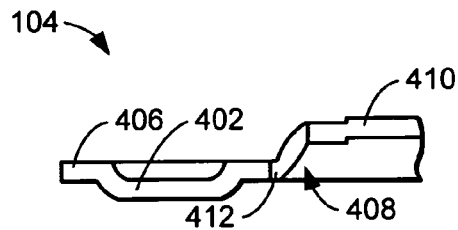
FIG. 4
FIG. 5
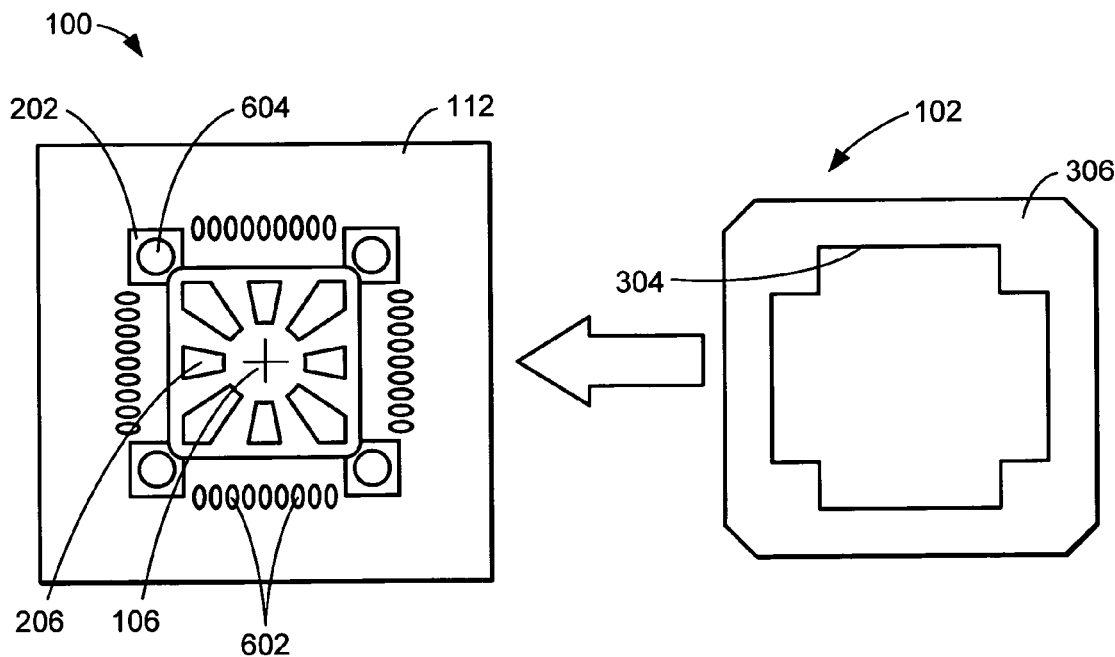
FIG. 6

INTEGRATED CIRCUIT PACKAGE SYSTEM WITH HEAT DISSIPATION ENCLOSURE

CROSS-REFERENCES TO RELATED APPLICATION(S)

This application claims the benefit of U.S. Provisional Patent Application Ser. No. 60/594,645 filed Apr. 26, 2005, and the subject matter thereof is hereby incorporated herein by reference thereto.

TECHNICAL FIELD

The present invention relates generally to integrated circuit packages and more particularly to heat dissipating integrated circuit package system.

BACKGROUND ART

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

Modern consumer electronics, such as smart phones, personal digital assistants, and location based services devices, are packing more integrated circuits into an ever shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures. As more functions are packed into the integrated circuits and more integrated circuits into the package, more heat is generated degrading the performance, the reliability and the life time of the integrated circuits. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever demanding thermal requirements of today's integrated circuits and packages. Most integrated circuit devices use molded plastic epoxy as an epoxy molding compound (EMC) for protecting package. But the poor heat dissipation property of EMC sometimes leads to device malfunctions.

The plastic ball grid array (PBGA) is a surface mount package in which the input/outputs are arrayed on the backside of the package in the form of various matrices of solder balls. This construction usually limits the electrical and thermal performance. Some applications require improved thermal and electrical performance in the same BGA package outline, which even utilized the same substrate material and design.

The generated heat at the integrated circuit die surface is used to emit to package top (~30%), package bottom (~60%) and package side (~10%) during device operation. To provide a thermal solution, many kinds of technology have been developed. The most representative technology is a heat slug mounting. But a heat slug by itself provides limited improvements in thermal performance. Current thermally enhanced ball grid array (TEBGA) packages use heat slugs to improve thermal performance, but these packages only provide a 15% improvement in thermal performance over a conventional plastic ball grid array (PBGA) package. However, even a TEBGA package is subject to performance problems because it uses EMC, which is low thermal conductivity material.

Thus, a need still remains for an integrated circuit package system providing low cost manufacturing, improved thermal performance, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing an integrated circuit die, and enclosing the integrated circuit die in a heat dissipation enclosure comprises mounting the integrated circuit die on a die paddle attaching a heat block ring to the die paddle around the integrated circuit die, and attaching a heat slug on the heat block ring over the integrated circuit die.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 1 is a cross-sectional view of an integrated circuit package system in an embodiment of the present invention;

FIG. 2 is a top view of the die paddle of the integrated circuit package system in an embodiment of the present invention;

FIG. 3 is a top view of the heat block ring of the integrated circuit package system in an embodiment of the present invention;

FIG. 4 is a top view of the heat slug of the integrated circuit package system in an embodiment of the present invention;

FIG. 5 is a more detailed cross-sectional view of the corner of the heat slug for an integrated circuit package system;

FIG. 6 is a top view of the integrated circuit package system in a mounting phase of the heat block ring;

BEST MODE FOR CARRYING OUT THE INVENTION

Figure 7:
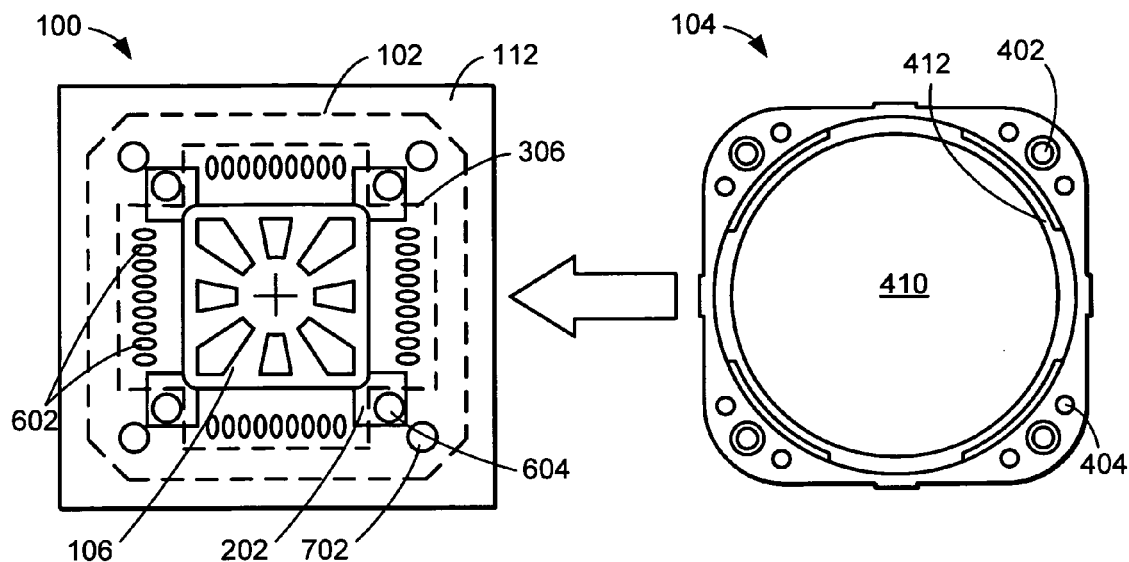
FIG. 7 is a top view of the integrated circuit package system in a mounting phase of the heat slug.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a cross-sectional view of an integrated circuit package system 100 in an embodiment of the present invention. The integrated circuit package system 100 provides a high thermal performance management system with thermal flow paths to a top and a bottom of the integrated circuit package system 100. A heat block ring 102 and a heat slug 104, attached to the heat block ring 102, along with a die paddle 106 forms a heat dissipation enclosure for an integrated circuit die 108 improving the thermal performance of the integrated circuit package system 100.

The integrated circuit die 108 attaches to the die paddle 106 with an adhesive 110, such as a high thermal epoxy. The die paddle 106 is in a substrate 112, such as an organic or inorganic substrate. The die paddle 106 may be formed from a number of thermally conductive materials, such as copper. Electrical interconnects 114, such as bond wires, attach between the integrated circuit die 108 and the substrate 112. A molding compound 116, such as an epoxy molding compound (EMC), encapsulates the heat block ring 102, the heat slug 104 with a top of the heat slug 104 exposed, the die paddle 106, the integrated circuit die 108, and the electrical interconnects onto the substrate 112.

The substrate 112 may have a metal layer (not shown) with traces for connections to the integrated circuit die 108, a metal layer (not shown) with traces for connections to external interconnects 118, such as solder balls, electrical vias (not shown) connecting the metal layers as required, and an insulator (not shown), such as a dielectric, isolating the various metal layers and electrical vias. The external interconnects 118 attach to the next system level (not shown), such as a printed circuit board. For illustrative purpose, the substrate 112 is described as having two metal layers, although it is understood that the number of layers may differ.

The heat dissipation enclosure includes the heat block ring 102, the heat slug 104, and the die paddle 106 as described supra but is not inclusive of the thermal dissipation paths for the integrated circuit package system 100. The substrate 112 with the traces in the metal layers and the electrical vias along with the external interconnects 118 form potential thermal paths dissipating heat from the integrated circuit die 108 to the next system level, serving as a larger heat sink with a higher capacity to dissipate heat.

As the integrated circuit die 108 generates heat, the heat may dissipate in any available paths with most dissipating in the paths of least thermal resistance. The heat block ring 102 attaches to the die paddle 106 and on the substrate 112 surrounding the integrated circuit die 108. The heat block ring 102 may be formed from a number of thermally conductive materials, such as copper. The heat block ring 102, the heat slug 104, and the die paddle 106 provide low thermal resistance paths spreading the heat away from the integrated circuit die 108 for dissipation.

The die paddle 106 dissipates heat from the integrated circuit die to the heat block ring 102 and through the substrate 112 to the external interconnects 118. The heat from the heat block ring 102 further dissipates, with the added surface area in contact with the heat block ring 102, to the heat slug 104, through the substrate 112 to the external interconnects 118, and the molding compound 116. The heat slug 104 may be embedded in a mold cap and exposed to dissipate heat to ambient or to an external cooling device or heat sink, such as a fan or cooling fins.

The substrate 112 also provides thermal paths for the heat from the integrated circuit die 108 to flow from the die paddle 106 through the metal layers and the electrical vias to the external interconnects 118 below or approximate to the die paddle 106. The molding compound 116 has a lower thermal conductivity or higher thermal resistance than the heat block ring 102, the heat slug 104, the die paddle 106, the traces, the electrical vias, and the external interconnects 118 resulting in a lower heat volume flowing into the molding compound 116 from the integrated circuit die 108.

Referring now to FIG. 2, therein is shown a top view of the die paddle 106 of the integrated circuit package system 100 in an embodiment of the present invention. The die paddle 106 includes a pad 202 connected to each corner of a central portion 204 of the die paddle 106 and channels 206 radiating from a center of the central portion 204.

The pad 202 may be used as a surface for adhesion to the die paddle 106 or an extension to the central portion 204 for die attachment to accommodate large die sizes. The pad 202 may serve to dissipate heat from a portion of the die paddle 106 in contact with the integrated circuit die 108 of FIG. 1 to other surface areas such as the heat block ring 102 of FIG. 1 and thermal paths through the substrate 112 of FIG. 1 not directly below the integrated circuit die 108. The channels 206 may provide bleeding and spreading control of the adhesive 110 of FIG. 1 or may be used for other utilities, such as providing additional ground connections or other connections.

For illustrative purpose, the central portion 204 is shown in a predetermined geometric shape of a square, although it is understood that the central portion 204 may be other predetermined geometric shapes. Also for illustrative purpose, the pad 202 are shown in a predetermined geometric shape as a square extending from the corners of the central portion 204, although it is understood the that the pad 202 be other predetermined geometric shapes or the central portion 204 may be larger to include the pad 202.

Referring now to FIG. 3, therein is shown a top view of the heat block ring 102 of the integrated circuit package system 100 in an embodiment of the present invention. The heat block ring 102 has a space 302 substantially at a center for the integrated circuit die 108 of FIG. 1. The space 302 has a recess 304 along each side of the heat block ring 102 providing predetermined clearance for the electrical interconnects 114 of FIG. 1 between the integrated circuit die 108 and the substrate 112 of FIG. 1. An inwardly extending pad 306 at each corner of the heat block ring 102 is for lining up over one of the pads 202 of FIG. 2 and helping form the recess 304. The outline of the heat block ring 102 is substantially square with the corners having an angled portion instead of the sides of the heat block ring 102 connecting in a perpendicular angle.

For illustrative purpose, the heat block ring 102 having the space 302 is shown as uniform, although it is understood that the heat block ring 102 may have other spaces, such as holes in the extension 306 for high thermal epoxy flow control. Also for illustrative purpose, the heat block ring 102 is shown as having the space with the extension 306 at each corner forming the recess 304 along the each side, although it is understood that the heat block ring 102 may have the space 302 of a different configuration.

Referring now to FIG. 4, therein is shown a top view of the heat slug 104 of the integrated circuit package system 100 in an embodiment of the present invention. The heat slug 104 is substantially square with rounded corners. Each corner has a depression 402, in a shape of a circle, and a hole 404, substantially located at opposing sides of the depression 402, on a registration region 406 of the heat slug 104. The hole 404 may help secure the heat slug 104 with the molding compound 116 of FIG. 1 in the hole 404. The heat slug 104 also includes a slope region 408 from the registration region 406 to a slug top 410 of the heat slug 104. The slope region 408 has a slit 412 along each of the corner for encapsulation.

Referring now to FIG. 5, therein is shown a more detailed cross-sectional view of the corner of the heat slug 104 for the integrated circuit package system 100. The cross-sectional view is along the line A to A' shown in FIG. 4. The depression 402 is concaved below the registration region 406 with a top of the concave providing registration for the molding compound 116 of FIG. 1. A bottom of each of the depression 402 attaches to each of the pad 202 of FIG. 3 with a high thermal epoxy. The registration region 406 provides additional surface space securing the heat slug 104 with the molding compound 116 and spreading the heat from the integrated circuit die 108 of FIG. 1. The slit 412 is in the slope region 408 between the registration region 406 and the slug top 410. The slug top 410 is elevated from the registration region 406 allowing predetermined clearance for the integrated circuit die 108 and the electrical interconnects 114 of FIG. 1 as required.

Referring now to FIG. 6, therein is shown a top view of the integrated circuit package system 100 in a mounting phase of the heat block ring 102. The top view depicts the substrate 112 with the heat block ring 102 offset undergoing attachment to the substrate 112 and to the die paddle 106. The substrate 112 includes bonding pads 602, such as bond fingers, for the electrical interconnects 114 of FIG. 1 and the die paddle 106 having the channels 206. A block epoxy 604, such as high thermal epoxy dot, is shown on each of the pad 202 to connect to the extension 306 of the heat block ring 102. The recess 304 provides clearance for the bonding pads 602 not to impede the electrical interconnects 114.

Referring now to FIG. 7, therein is shown a top view of the integrated circuit package system 100 in a mounting phase of the heat slug 104. The top view depicts the heat block ring 102 as a dashed outline and the heat slug 104 offset undergoing attachment to the heat block ring 102. The top view also depicts the substrate 112, the die paddle 106, the pad 202, the channels, and the bonding pads 602 having the block epoxy 604.

The depression 402 attaches on the extension 306 with a slug epoxy 702. The hole 404 may help secure the heat slug 104 with the molding compound 116 through the hole 404. The hole 404 may also provide control spreading of the slug epoxy 702. The area of the slug top 410 provides predetermined clearance for the integrated circuit die 108 of FIG. 1 and the electrical interconnects 114. The slit 412 provides channels for the flow of the molding compound 116.

Figure 8:
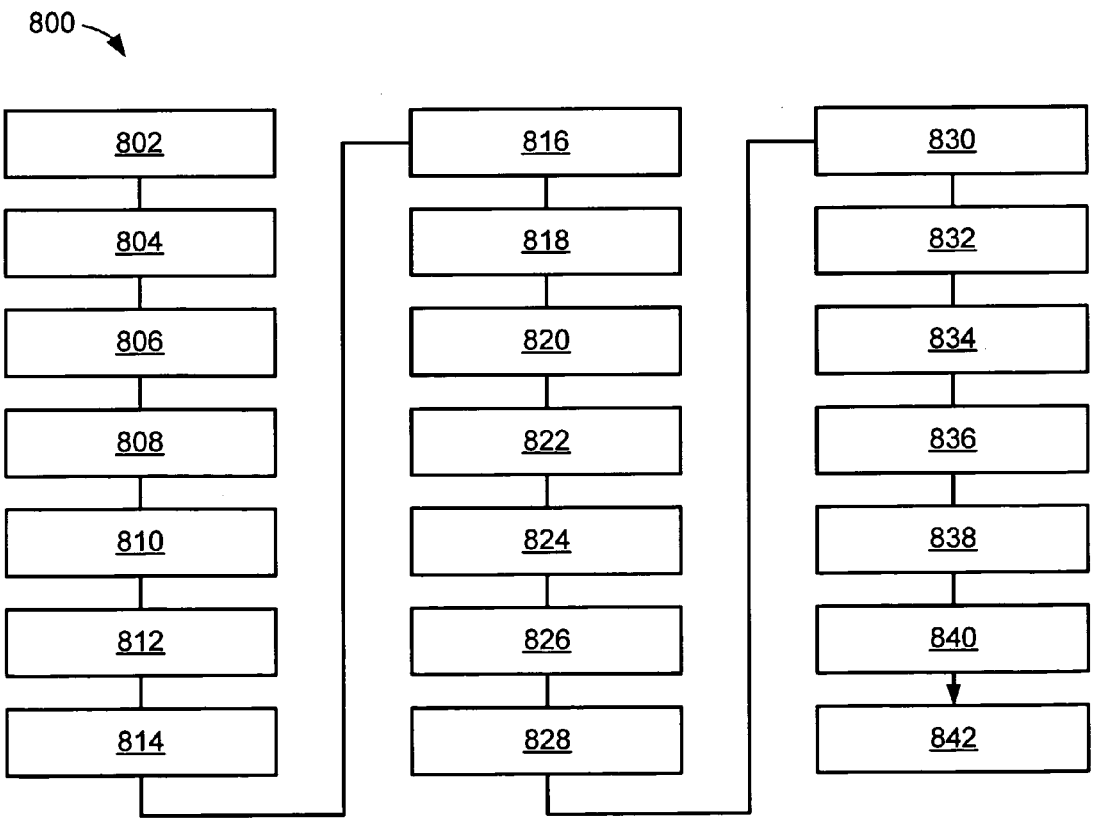
FIG. 8 is flow chart of a manufacturing system for a wafer level processing system in an embodiment of the present invention.

Referring now to FIG. 8, therein is shown a flow chart of a manufacturing system 800 for a wafer level processing system in an embodiment of the present invention. The manufacturing system 800 includes back grinding a wafer with circuitry fabricated thereon in a block 802; sawing the wafer to form integrated circuit dice in a block 804; inspecting a substrate assembly having a substrate, a die paddle, and bonding pads in a block 806; baking the substrate assembly in a block 808; attaching an integrated circuit die to the substrate with a die-attach adhesive in a block 810; curing the die-attach adhesive in a block 812; mounting a heat block ring (HBR) to the die paddle and on the substrate with a thermal epoxy in a block 814; curing the thermal epoxy for HBR attach in a block 816; cleaning the substrate assembly with the integrated circuit die and HBR thereon with plasma in a block 818; connecting electrical interconnects between the integrated circuit die and the bonding pads in a block 820; inspecting connections of the electrical interconnects in a block 822; mounting a heat slug (HS) on the heat block ring over the integrated circuit die and the electrical interconnects with a thermal epoxy in a block 824; curing the thermal epoxy for HS in a block 826; cleaning the substrate assembly having the HS mounted with plasma in a block 828; molding the substrate assembly having the HS mounted with a molding compound in a block 830; marking the pad on the mold in a block 832; curing the molding compound in a block 834; marking an identification on the molding in a block 836; mounting external interconnects to the substrate in a block 838; inspecting package in a block 840; and testing as well as packing the package in a block 842.

Figure 9:
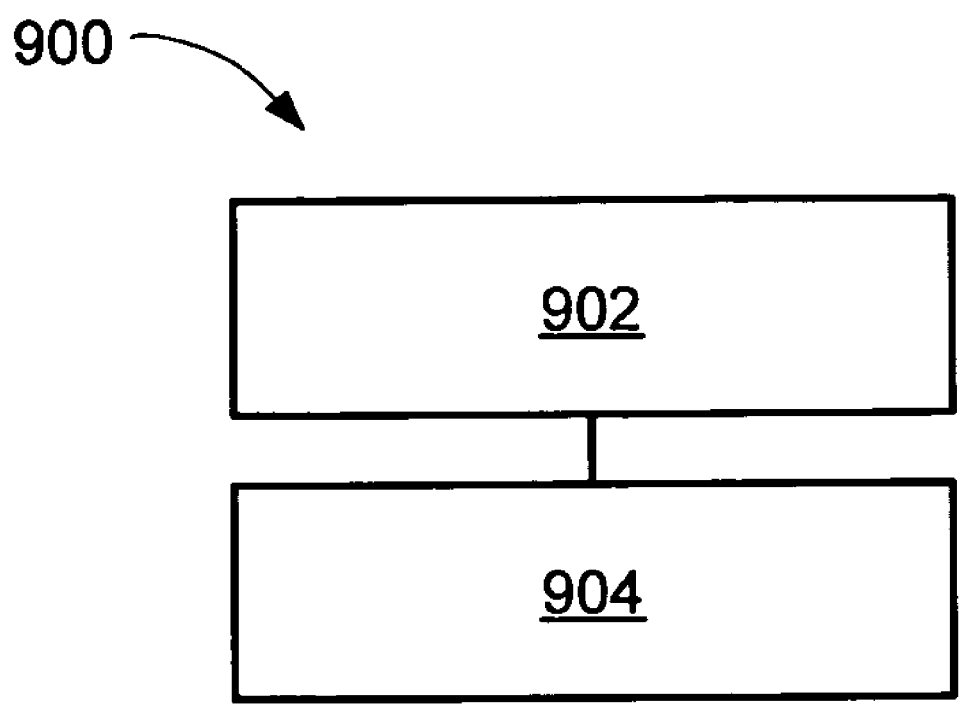
FIG. 9 is a flow chart of an integrated circuit package system for manufacture of the integrated circuit package system in an embodiment of the present invention.

Referring now to FIG. 9, therein is shown a flow chart of an integrated circuit package system 900 for manufacture of the integrated circuit package system 100 in an embodiment of the present invention. The system 900 includes providing an integrated circuit die in a block 902; and enclosing the integrated circuit die in a heat dissipation enclosure comprises mounting the integrated circuit die on a die paddle attaching a heat block ring to the die paddle around the integrated circuit die, and attaching a heat slug on the heat block ring over the integrated circuit die in a block 904.

It has been discovered that the present invention thus has numerous aspects.

It has been discovered that heat dissipation from an integrated circuit die can be significantly improved over a thermally enhanced ball grid array (TEBGA) forming a heat dissipation enclosure, around an integrated circuit die, including a unique die paddle with the integrated circuit die thereon, a heat block ring on the die paddle and a substrate of the package, and the heat slug on the heat block ring.

It has been also discovered that the new design of the die paddle, heat slug and heat block ring forms a thermally enhanced ball grid array heat ring (TEBGA HR) type package increasing the thermal, electrical and reliability performance while maintaining the same package outline, substrate material due to unique construction and materials. This allows re-use of many existing manufacturing equipments resulting in higher performance for lower cost.

An aspect is that the efficient dissipation of the generated heat is a volume reduction of mold compound having low thermal conductivity (0.8~0.9 W/mK) encapsulating the package and a volume increase of Cu heat slug and Cu heat block ring having high thermal conductivity (~350 W/mK).

The TEBGA HR type package by using a heat slug and heat block ring that is embedded into the mold cap is that heat is to be more easily conducted out of the package topside. The heat transfer path through the heat block ring and the heat slug mitigates the path through the molding compound.

Another aspect of the present invention is that the present invention provides lower thermal resistance path with the die paddle of copper compared to the higher thermal resistance of an epoxy molding compound. The die paddle spreads the heat to a larger surface area such that more of the substrate may dissipate the heat to the solder balls to the next system level, serving as a large heat sink with a larger capacity to dissipate heat. The die paddle also spreads the heat from the integrated circuit die to the heat block ring. The TEBGA HR type package spreads some part of discharged heat previously toward substrate bottom to now transfer heat to the package topside with the heat slug, heat block ring and the unique die paddle.

Yet another important aspect of the present invention is that the heat slug provides another heat transfer path from the heat block ring to the sides of the package but more importantly to the top of the package. The heat slug, if exposed may dissipate heat to ambient or may be connect to other external cooling devices, such as fan or cooling fins. The heat slug will continue to provide thermal path for any heat volume from the integrated circuit die through the molding compound.

Yet another important aspect of the present invention is that the package reliability performance will be improved with a non-water absorption material (Cu) reduces the amount of water absorption material (molding compound).

Yet another aspect of the present invention is that the heat dissipation enclosure may be formed of various configurations to work with different sizes, thickness, and electrical interconnect structures.

Yet another important aspect of the present invention is that it valuably supports and services the historical trend of reducing costs and increasing performance. These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. An integrated circuit package manufacturing method comprising:
   providing an integrated circuit die; and
   enclosing the integrated circuit die in a heat dissipation enclosure comprises:
      mounting the integrated circuit die on a die paddle having discrete pads connected to corners of a central portion thereof,
      attaching a heat block ring to the pad and around the integrated circuit die with the heat block ring having inwardly extending pads lining up over the discrete pads, and
      attaching a heat slug on the heat block ring over the integrated circuit die.

2. The method as claimed in claim 1 wherein attaching the heat block ring to the die paddle around the integrated circuit die includes forming the heat block ring having a recess for an electrical interconnect connected to the integrated circuit die.

3. The method as claimed in claim 1 wherein enclosing the integrated circuit die in the heat dissipation enclosure comprises:
   forming a substrate having the die paddle therein;
   mounting the integrated circuit die on the die paddle; and
   thermally connecting an external interconnect through the substrate and the die paddle to the integrated circuit die.

4. The method as claimed in claim 1 wherein enclosing the integrated circuit die in the heat dissipation enclosure comprises:
   providing a substrate having the die paddle therein;
   mounting the integrated circuit die on the die paddle;
   attaching the heat block ring on the substrate around the integrated circuit die; and
   thermally connecting an external interconnect through the substrate to the heat block ring.

5. The method as claimed in claim 1 further comprising encapsulating the integrated circuit die and the heat dissipation enclosure.

6. An integrated circuit package manufacturing method comprising:
   providing an integrated circuit die;
   enclosing the integrated circuit die in a heat dissipation enclosure comprises:
      mounting the integrated circuit die on a substrate having a die paddle having discrete pads connected to corners of a central portion thereof,
      attaching a heat block ring on the pad and the substrate around the integrated circuit die with the heat block ring having inwardly extending pads lining up over the discrete pads, and
      attaching a heat slug on the heat block ring over the integrated circuit die; and
   attaching an external interconnect to the substrate on a side opposite the heat dissipation enclosure.

7. The method as claimed in claim 6 further comprising connecting an electrical interconnect between the integrated circuit die and the substrate.

8. The method as claimed in claim 6 wherein mounting the integrated circuit die on the substrate having the die paddle includes forming the substrate having a metal layer.

9. The method as claimed in claim 6 wherein mounting the integrated circuit die on the substrate having the die paddle includes forming the substrate having an electrical via.

10. The method as claimed in claim 6 wherein enclosing the integrated circuit die in the heat dissipation enclosure includes forming the heat dissipation enclosure with a thermally conductive material.

11. An integrated circuit package system comprising:
   an integrated circuit die;
   a die paddle for supporting the integrated circuit die, the die paddle having discrete pads connected to corners of a central portion thereof;
   a heat block ring attached to the pad and around the integrated circuit die with the heat block ring having inwardly extending pads lining up over the discrete pads; and a heat slug on the heat block ring over the integrated circuit die for forming a heat dissipation enclosure.

12. The system as claimed in claim 11 wherein the heat block ring attached to the die paddle around the integrated circuit die includes the heat block ring having a recess for an electrical interconnect connected to the integrated circuit die.

13. The system as claimed in claim 11 further comprising:
a substrate having the die paddle therein; and
an external interconnect thermally connected though the substrate and the die paddle to the integrated circuit die.

14. The system as claimed in claim 11 further comprising:
a substrate having the die paddle therein;
the heat block ring on the substrate around the integrated circuit die; and
an external interconnect thermally connected through the substrate to the heat block ring.

15. The system as claimed in claim 11 further comprising a molding compound to cover the integrated circuit die and the heat dissipation enclosure.

16. The system as claimed in claim 11 further comprising:
a substrate having the die paddle therein; and
an external interconnect on the substrate on a side opposite the heat dissipation enclosure.

17. The system as claimed in claim 16 further comprising an electrical interconnect between the integrated circuit die and the substrate.

18. The system as claimed in claim 16 wherein the substrate has a metal layer.

19. The system as claimed in claim 16 wherein the substrate has an electrical via.

20. The system as claimed in claim 16 wherein the heat block ring and the heat slug are of a thermally conductive material.

* * * * *